(12) United States Patent
Barford (10) Patent No.: US 7,958,178 B2
(45) Date of Patent: Jun. 7, 2011

(54) FINITE IMPULSE RESPONSE FILTER FOR A TIME-SYNCHRONIZED SYSTEM

(75) Inventor: Lee Alton Barford, San Jose, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 1579 days.

(21) Appl. No.: 11/298,246

(22) Filed: Dec. 9, 2005

(65) Prior Publication Data

US 2007/0136410 A1   Jun. 14, 2007

(51) Int. Cl.
*G06F 17/10* (2006.01)
(52) U.S. Cl. ...................................................... 708/319
(58) Field of Classification Search .................. 708/319
See application file for complete search history.

(56) References Cited

U.S. PATENT DOCUMENTS

| 2002/0044014 | A1* | 4/2002 | Wright et al. ............... 330/2 |
| 2004/0139135 | A1* | 7/2004 | Druck ............................ 708/319 |
| 2005/0246404 | A1 | 11/2005 | Aramaki |
| 2006/0244644 | A1 | 11/2006 | Zoso et al. |

OTHER PUBLICATIONS

UK Intellectual Property Office, Patents Act 1977 Search Report under Section 17, May 3, 2007.

* cited by examiner

*Primary Examiner* — Chuong D Ngo (57) ABSTRACT

A Finite Impulse Response ("FIR") filter that uses an approximation of the time integral of the impulse response derived from data collected at non-uniform intervals and processes time-synchronized measurements taken at uneven intervals.

17 Claims, 7 Drawing Sheets

FINITE IMPULSE RESPONSE FILTER FOR A TIME-SYNCHRONIZED SYSTEM

BACKGROUND OF THE INVENTION

Traditional Finite Impulse Response ("FIR") filters are generally designed as "linear phase" filters that delay input signals but do not distort the phase of the input signals. Typically these FIR filters are suited for multi-rate applications (such as reduced sampling rate, increased sampling rate, or both) and enable greater computational efficiencies than other types of filters, such as Infinite Impulse Response ("IIR") filters, which require that each output of the IIR be individually calculated. Additionally, FIR filters have desirable numeric properties when utilized in digital signal processors ("DSPs"). Moreover, FIR filters have no feedback so they are implemented typically utilizing fewer bits than IIR filters.

It is appreciated by those skilled in the art that FIR filters have an "impulse response" that is a set of FIR coefficients. Additionally, FIR filters have "tap" values that may be coefficients, delay pairs, or both. Generally, the number of FIR taps (typically identified as "N") is an indication of the amount of memory required to implement the FIR filter, the number of calculations required, and the amount of "filtering" the FIR filter is capable of performing. Therefore, the greater the number of taps, the greater the stop-band attenuation, the less ripple, and the narrower the FIR filter.

In operation, traditional FIR filters require that samples be acquired at even time intervals. However, non-linear filtering in a time-synchronized system (such as a measurement system or control system) generally requires measurements taken at times determined by stimuli and this stimuli is generally not under the control of a measurement or control system. Other types of filtering approaches exist that may be utilized in a time-synchronized measurement or control system that have measurements taken at times determined by stimuli. Unfortunately, these other known filtering approaches often are excessive and have computation times that are too large for DSP implementation.

Therefore, there is a need to implement an FIR filter for linear and non-linear filtering in time-synchronized systems where the measurements are taken at times that are determined by stimuli. Additionally, there is a need for the new FIR filter to be implementable in a DSP.

SUMMARY

A system under test coupled to measurement device A and measurement device B that are also connected to a timing source and time synchronized to generate measurements "a0" at time "ta0", "a1" at time "ta1", etc. . . . , is disclosed. Similarly, the measurement device B generates a measurement "b0" at time "tb0", "b1" at time "tb1", etc. . . . The output of measurement device A and measurement device B are collected at a digital signal processor that implements a plurality of instructions for FIR filtering. The output of the FIR filter, (tc0,c0), (tc1,c1), etc . . . is then available for further processing or analysis.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

DETAILED DESCRIPTION

Figure 1:
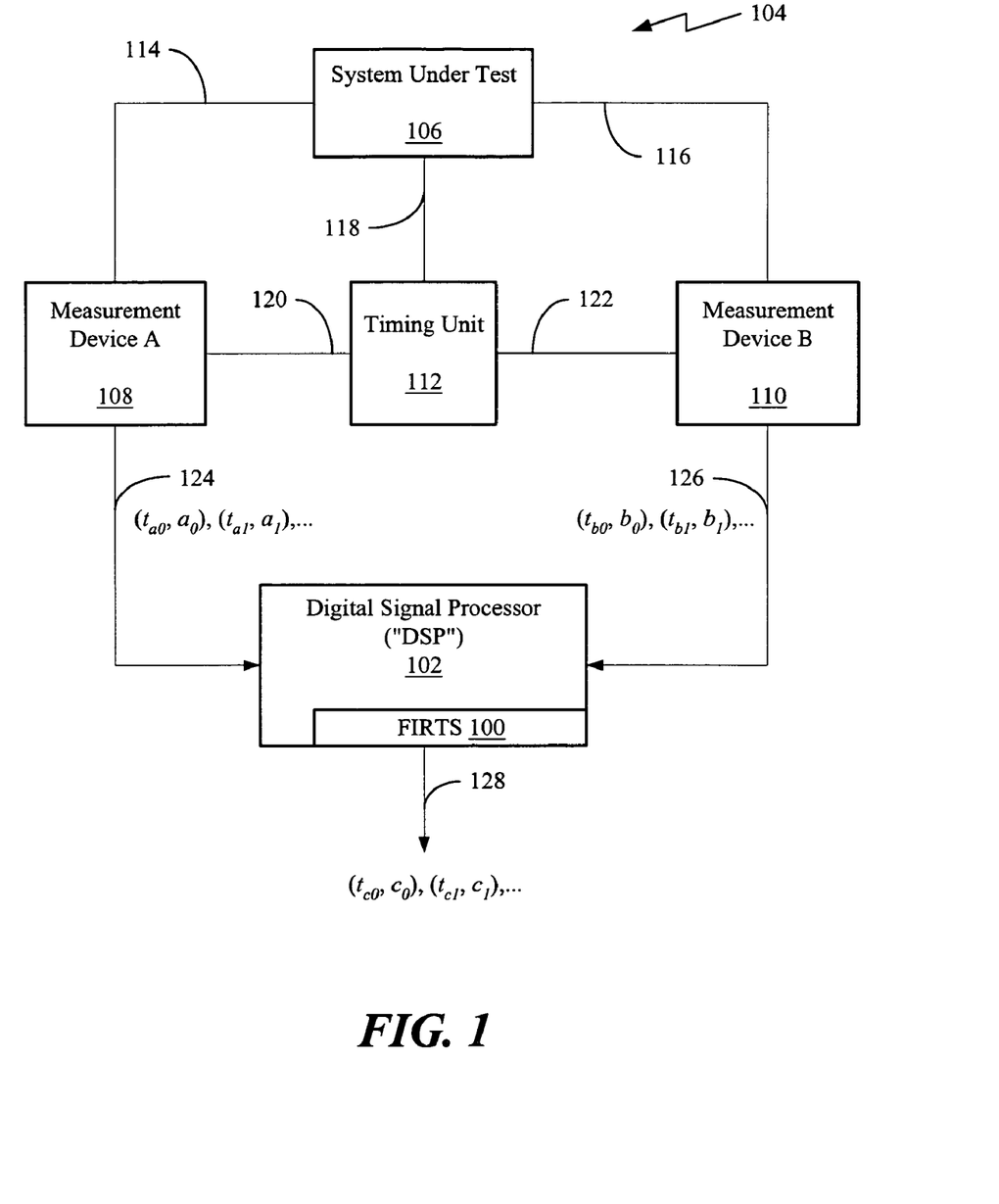
FIG. 1 shows a block diagram of an example of an implementation of a Finite Impulse Response ("FIR") filter for a time-synchronized system ("FIRTS") that is implemented within a Digital Signal Processor ("DSP"), which is part of a test system, where the measurements of the test system are time-synchronized.

An approach for implementation of a Finite Impulse Response ("FIR") filter for a time-synchronized system ("FIRTS") is described. The time-synchronized system may be a time-synchronized measurement system, time-synchronized control systems, or both. In FIG. 1, a block diagram of an example of an implementation of a FIRTS 100 that is implemented within a controller, such as Digital Signal Processor ("DSP") 102 is shown within a test system 104 where the measurements of the test system 104 are time-synchronized. As an example, the test system 104 may include a system under test 106 (also known as a device under test "DUT"), measurement devices (such as, for example, measurement device A 108 and measurement device B 110), and a timing unit 112. In this example, the system under test 106 may be in signal communication with measurement device A 108, measurement device B 110, and timing unit 112 via signal paths 114, 116, and 118, respectively. Additionally, the timing unit 112 may be in signal communication with both the measurement device A 108 and measurement device B 110 via signal paths 120 and 122, respectively. The DSP 102 may also be in signal communication with both the measurement device A 108 and measurement device B 110 via signal paths 124 and 126, respectively.

It is appreciated by those skilled in the art that the system under test 106 may be an individual component or a combination of components making up a system. Additionally, the measurement device A 108 and measurement device B 110 may be each an individual test measurement unit, such as, for example, a signal analyzer, a digital voltage meter, or other electrical/signal measurement device. The system under test 106, measurement device A 108 and measurement device B 110 may be time synchronized to the timing unit 112 via signal paths 118, 120, and 122, respectively. As an example, the timing unit 112 may utilize IEEE 1588 precision time protocol. In this example, the measurement device A 108 may generate measurements "$a_0$" at time "$t_{a0}$", "$a_1$" at time "$t_{a1}$", etc. Similarly, the measurement device B 110 may generate measurements "$b_0$" at time "$t_{b0}$", "$b_1$" at time "$t_{b1}$", etc. These measurements are time synchronized, but not triggered at set time intervals.

The output of measurement devices A 108 and B 110 are collected at the DSP 102, via signal paths 124 and 126, respectively. In other implementations, the output may be stored in memory accessed by DSP 102. The DSP 102 then implements a plurality of instructions for the FIRTS 100. The output of the FIRTS 100 along signal path 128, i.e., ($t_{c0}$, $c_0$), ($t_{c1}$, $c_1$), etc., is then available for further processing or analysis.

The FIR filter in the FIRTS currently being implemented has an impulse response I(k), where I(k) is the time integral of that impulse response. Thus, when an approximation for I(k) is derived, a signal filtered by convolution with the desired impulse response may be obtained by summing the product of sample values with appropriate values of I(k).

One such approximation for I(k) may be made via a spline. The spline is an approach used to accurately approximate I(k) that may be easily implemented in signal processing hardware or other controller with a fast execution time, for example, DSP, FPGA, a microprocessor with little or limited floating point support to name but a few. Other approximation approaches may be used instead of a spline, for example: polynomial interpolation (such as Legendre interpolation) through the points K and/or additional points, least squares polynomial fitting, a neural network as a universal approximator of the function I(k), a Fourier series to approximate I(k), and implementing the sine integral function in floating point or fixed point software, producing an extremely accurate approximation of the equation for I(k) (up to full floating point precision, say 15 digits for IEEE double precision) at the cost of execution time (a free, open source implementation of software for the sine integral function (sinint) is available from the GNU software organization). The sine integral function implemented in software may be used to compute the exact (up to floating point precision) values of the function I(k).

Using the spline, if I(k) is the integral of the time-domain impulse response of a sinc filter with the center frequency and bandwidth windowed with a windowing function (to prevent leakage), such as a hanning window function, with the limits of integration being 0 and k, where sinint is the integral of the sinc function results in the following equation for I(k):

$$I(k) = (2*\sin int((b-2*c)*pi*k) + 2*\sin int((b+2*c)*pi*k) + \sin int((pi*(-1+b*w-2*c*w)+k)/w) + \ldots \\ \sin int((pi*(1+b*w-2*c*w)*k)/w) + \sin int((pi*(-1+b*w+2*c*w)*k)/w) + \ldots \sin int((pi*(1+b*w+2*c*w)*k)/w))/(4*pi).$$

Any number of well-known windowing functions other than a hanning windowing function, for example, a cosine window, may be used with possible decreases in performance (e.g., computation time, filter roll off).

A set of knot points K is a superset of all of the local maxima and minima of I(k) for $-w<=k<=w$. These local maxima and minima occur at 1/b, -1/b, 2/b, -2/b, 3/b, -3/b, ... and -(1-1/2)/2c, (1-1/2)/2c, -(1+1/2)/2c, (1+1/2)/2c, -(2-1/2)/2c, (2-1/2)/2c, -(2+1/2)/2c, (2+1/2)/2c, -(3-1/2)/2c, (3-1/2)/2c, -(3+1/2)/2c, (3+1/2)/2c, . . . where K includes end points 0, w, and -w. Additional points may be added to K between these maxima, minima, and end points in order to achieve the desired filter accuracy. It may also be desirable to add sufficient additional points to achieve a fitting error that is less than the errors induced by the digitization process in the measurement.

For measurements originating in a 12-bit digitizer, sufficient additional points may be: five evenly-spaced knots between each adjacent pairs of maxima or minima, for $-w/2<=K<=w/2$. Typically, no additional points are required for values of k further from zero, because I(t) becomes fairly flat.

The coefficients "C" of a spine may be computed usually as a cubic spline, with knots K that interpolate I(k) at k, that is, the spline has value I(k) for each k in K. Algorithms and software for determining C are known in the art. For example, the open source package pppack from netlib.org and Matlab Spline Toolbox from THE MATHWORKS INC. provide functions for computing C when given inputs K and I(k) for each k in K. The knots K and coefficients C may be stored in human or computer-readable medium for use to implement the FIR filter in the FIRTS 100.

Figure 2:
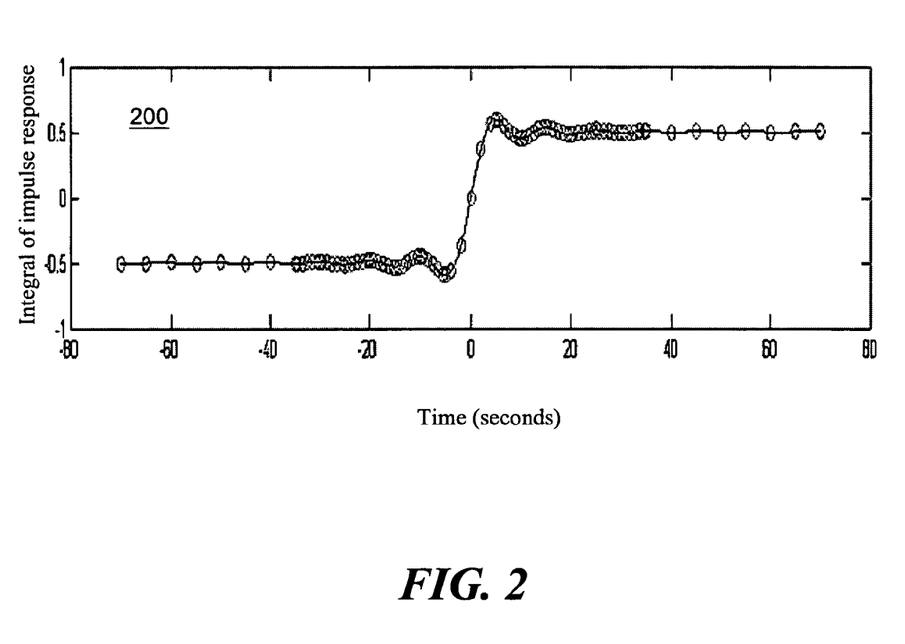
FIG. 2 shows a graph of an example plot of an integral "I(t)" of the impulse response of the FIRTS shown in FIG. 1.

Turning to FIG. 2, a graph of an example plot 200 is shown of an integral "I(t)" of the impulse response of the harming windowed sine FIR filter in the FIRTS 100 versus time in seconds. In this example, the impulse response of the hanning windowed sinc FIR filter in the FIRTS 100 has a center frequency ("$f_c$") equal to 0.05 Hz and a bandwidth ("b") equal to 0.1 Hz. The impulse response length of the hanning windowed sinc FIR filter is 2w where, as an example, "w"=7*(max(1/b, 1/(2c))). As a result, there are 7 cycles of the slowest oscillation of the filter impulse response on each side of time value of time equals 0 seconds. The circles of FIG. 2 show the "knots" of the interpolating cubic spline utilized to generate the impulse response. If a lowpass filter (not shown) with cutoff frequency "$f_u$" is also implemented in the DSP 102, in an alternate implementation example, then $f_c$ would be equal to half of $f_u$ and the bandwidth would be equal to $f_u$.

Figure 3:
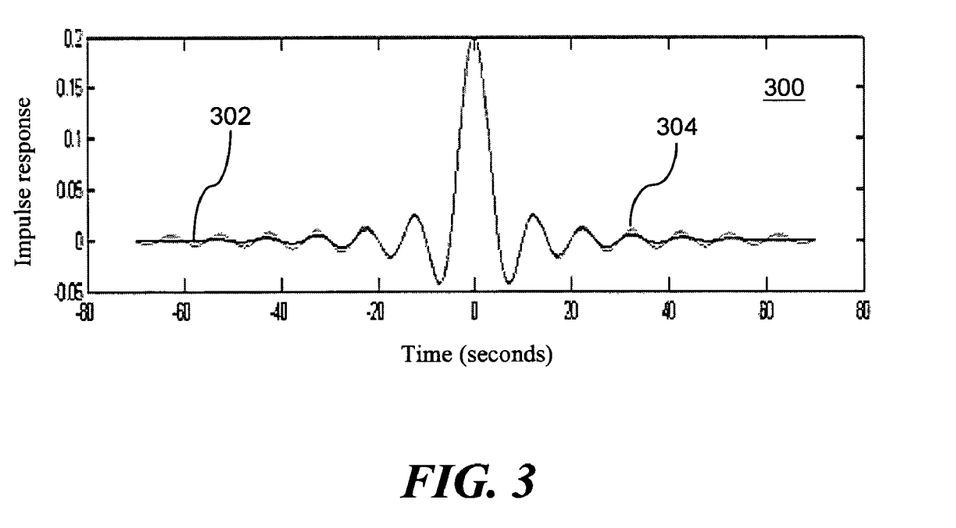
FIG. 3 shows a graph of an example plot of the impulse response of the FIRTS shown in FIG. 1.

Turning to FIG. 3, a graph 300 of the impulse response of the hanning windowed sinc FIR filter in the FIRTS 100 of FIG. 1 is shown. The graph 300 is of the impulse response 302 of the FIR filter and the impulse response 304 of the original, un-windowed sinc filter. The significant difference between 302 and 304 is due to the windowing function.

Figure 4:
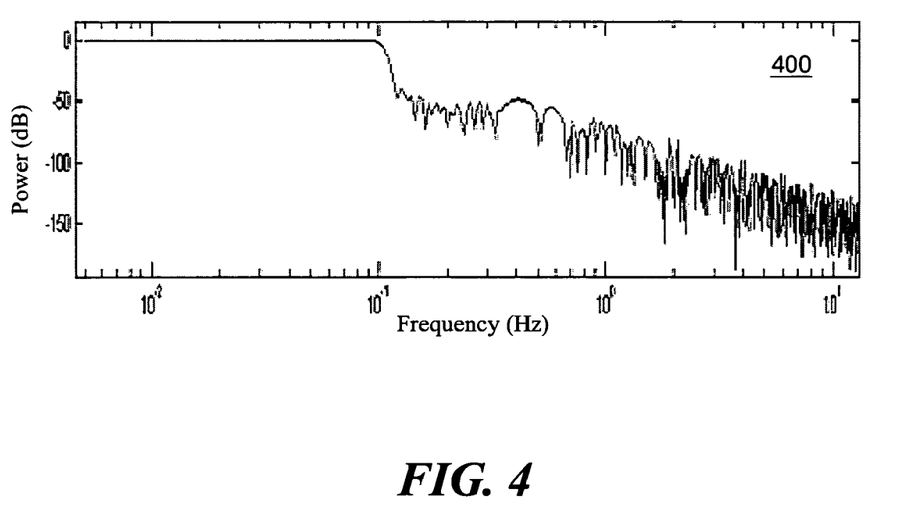
FIG. 4 shows a graph of an example plot of the power of a frequency response of the FIRTS shown in FIG. 1.
Figure 5:
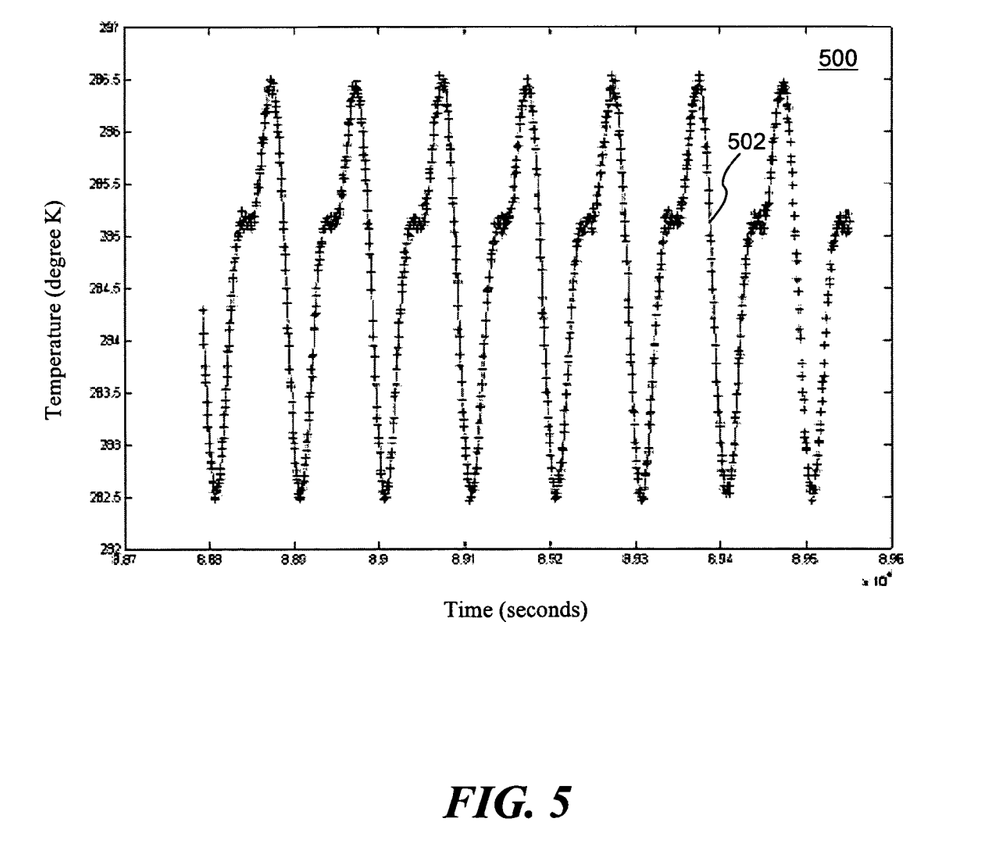
FIG. 5 shows a graph of the hanning windowed sinc FIR filter in the FIRTS of FIG. 1 applied to time stamped data.
Figure 6:
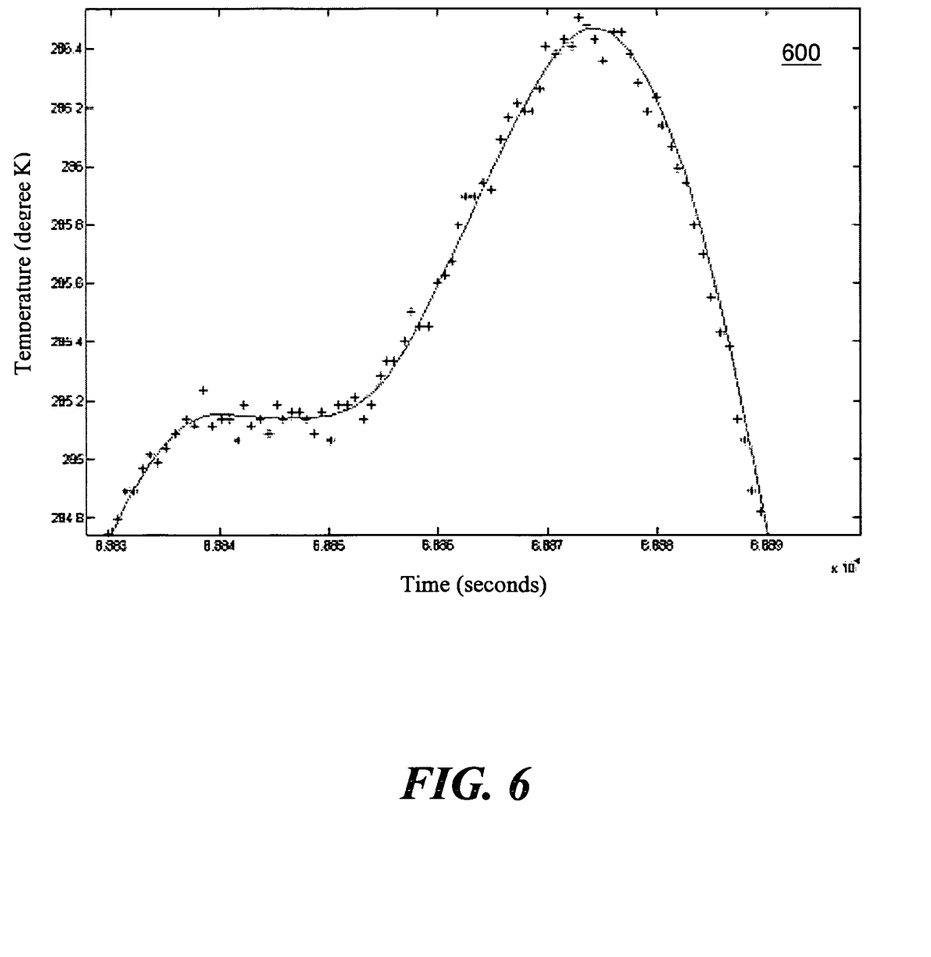
FIG. 6 shows a close up of a portion of the graph of FIG. 5.

In FIG. 4, a graph 400 of the power of the frequency response of the hanning windowed FIR filter of the FIRTS 100 of FIG. 1 is shown. The power of the frequency response starts strong and then tails off. It can be seen the FIR filter rolls off at about 50 dB per decade. In FIG. 5, a graph 500 of the hanning windowed FIR filter in the FIRTS of FIG. 1 is applied to time stamped data. The x-axis has increments of timestamps in seconds. The y-axis is a measured temperature. The x's show timestamp/measurement pairs input to the FIR filter. The curve 502 shows the filter output. In FIG. 6, a close up of a portion 600 of the graph 500 of FIG. 5 is shown.

Figure 7:
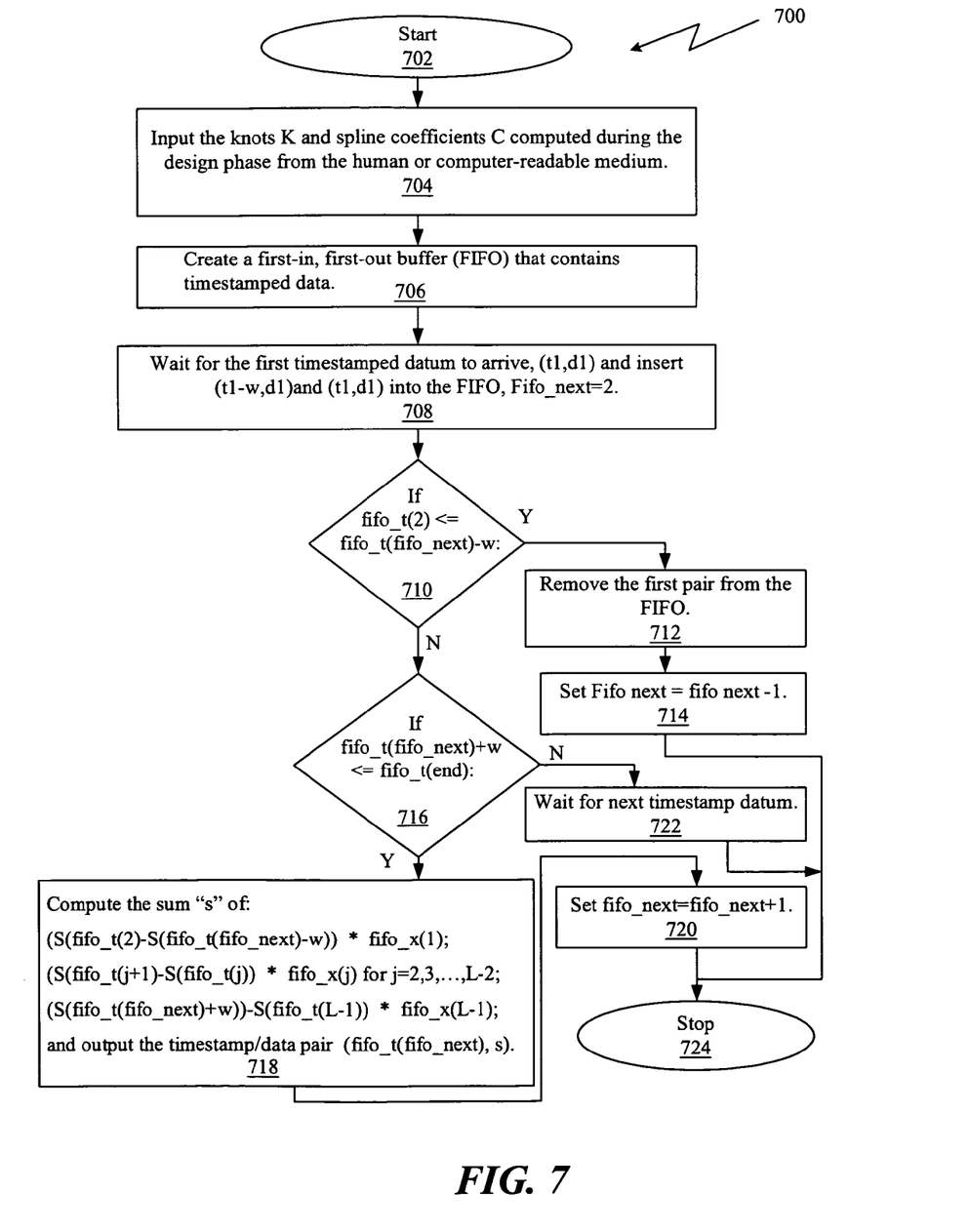
FIG. 7 shows a flowchart illustrating an example of the process preformed by the operation of the FIRTS shown in FIG. 1.

Turning to FIG. 7, a flow diagram 700 of the FIR filter in FIRTS 100 of FIG. 1 is shown. The diagram starts 702 with the knots "K" and spline coefficients "C" being determined or if already determined, being inputted from the human user interface or computer-readable medium. Further, "w" is known from "K", as the first and last knots are "-w" and "w," respectively, and the function S(t) is the result of evaluating the spline at time "t", determined by "K" and "C" in step 704. In step 706, data structure such as a first-in, first-out buffer (FIFO) may be created to contain time-stamped data. In other implementations, other types of data structures may be used in place of the FIFO buffer. Each element of the data structure may have two entries: one for the timestamp and one for the corresponding datum. For discussion purposes, the times in the data structure may be called fifo_t(1), fifo_t(2), ... and the data values in the FIFO fifo_x(1), fifo_x(2), ... with lower index values representing time/data pairs inserted into the FIFO earlier. Also, "L" may represent the current number of pairs in the FIFO.

In step 708, the FIRTS time stamped datum arrive (t1,d1) at a processor, such as DSP 110 and (t1−w,d1) and (t1,d1) is inserted into the FIFO data structure and the Fifo_next index into the data structure is then set to two. If the fifo_t(2)<=fifo_t(fifo_next)−w in step decision 710, then the first pair of datum is removed from the FIFO data structure 712. The Fifo_next index is then set to fifo_next−1 in step 714 and the process stops in step 724.

If not fifo_t(2)<=fifo_t(fifo_next)−w, then a determination is made if fifo_t(fifo_next)+w<=fifo_t(end) in decision step 716. If fifo_t(fifo_next)+w<=fifo_t(end) in decision step 716, then compute the sum "s" of (S(fifo_t(2)−S(fifo_t(fifo_next)−w))*fifo_x(1); (S(fifo_t(j+1)−S(fifo_t(j))*fifo_x(j) for j=2, 3, . . . , L−2; and (S(fifo_t(fifo_next)+w))−S(fifo_t(L−1))*fifo_x(L−1), and output the timestamp/data pair (fifo_t(fifo_next), s) in step 718. The fifo_next is then incremented by fifo_next=fifo_next+1 in step 720 and processing may stop at step 724. If not fifo_t(fifo_next)+w<=fifo_t(end) in step 716, then a wait state is entered until the next timestamp datum is available in step 722 and processing stops at step 724. Thus, a FIRTS 100 may be implemented within a DSP 110 and efficiently process time synchronized data.

Step 724 is shown as the flow stopping, but in practice the flow may loop back to a previous step, such as step 708 in a continuous loop as long as the DSP 110 is initialized and processing data.

It is appreciated by those skilled in the art that the process shown in FIG. 7 may selectively be implemented in hardware, software, or a combination of hardware and software. An embodiment of the process steps employs at least one machine-readable signal bearing medium. Examples of machine-readable signal bearing mediums include computer-readable mediums such as a magnetic storage medium (i.e., floppy disks, or optical storage such as compact disk ("CD") or digital video disk ("DVD"), a biological storage medium, or an atomic storage medium, a discrete logic circuit(s) having logic gates for implementing logic functions upon data signals, an application specific integrated circuit having appropriate logic gates, a programmable gate array(s) ("PGA"), a field programmable gate array ("FPGA"), a random access memory device ("RAM"), read only memory device ("ROM"), electronic programmable random access memory ("EPROM"), or equivalent. Note that the computer-readable medium could even be paper or another suitable medium, upon which the computer instruction is printed, as the program can be electronically captured, via for instance, optical scanning of the paper or other medium, then compiled, interpreted or otherwise processed in a suitable manner if necessary, and then stored in a computer memory.

Additionally, a machine-readable signal bearing medium includes computer-readable signal bearing media. Computer-readable signal bearing media have a modulated carrier signal transmitted over one or more wire-based, wireless or fiber optic networks or within a system. For example, one or more wire-based, wireless or fiber optic networks, such as the telephone network, a local area network, the Internet, or a wireless network having a component of a computer-readable signal residing or passing through the network. The computer-readable signal is a representation of one or more machine instructions written in or implemented with any number of programming languages.

Furthermore, the multiple process steps implemented with a programming language, which includes an ordered listing of executable instructions for implementing logical functions, can be embodied in any machine-readable signal bearing medium for use by or in connection with an instruction execution system, apparatus, or device, such as a computer-based system, controller-containing system having a processor or controller, such as a microprocessor, digital signal processor, discrete logic circuit functioning as a controller, or other system that can fetch the instructions from the instruction execution system, apparatus, or device and execute the instructions.

The foregoing description of an implementation has been presented for purposes of illustration and description. It is not exhaustive and does not limit the claimed inventions to the precise form disclosed. Modifications and variations are possible in light of the above description or may be acquired from practicing the invention. For example, the described implementation includes software but the invention may be implemented as a combination of hardware and software or in hardware alone. Note also that the implementation may vary between systems. The claims and their equivalents define the scope of the invention.

What is claimed is:

1. A Finite Impulse Response ("FIR") filter for a time-synchronized system ("FIRTS"), the FIRTS comprising:
  a controller for receiving input data collected at non-uniform intervals;
  a data structure accessed by the controller that contains the input data made up of a plurality of at least a timestamp and datum; and
  a FIR filter with an impulse response implemented by the controller and having an integral I(k) of the impulse response in the time domain that is approximated using the input data that results in filtered data; wherein said FIR filter processes the input data using the integral I(k) to obtain the filtered data.

2. The FIRTS of claim 1, wherein the integral I(k) further has a predetermined bandwidth windowed with a windowing function.

3. The FIRTS of claim 1, wherein the integral I(k) comprises: a plurality of knots k with a first knot at k=−w and a last knot at k=w; and said integral I(k) is approximated by a spline having a plurality of spline coefficients associated with the spline where the spline is determined at time t using the plurality of knots and the plurality of spline coefficients.

4. The FIRTS of claim 3, wherein the filtered data is obtained by computing a sum s of S(fifo_t(2)−S(fifo_t(fifo_next)−w))*fifo_x(1) and (S(fifo_t(j+1)−S(fifo_t(j))*fifo_x(j) for j=2, 3, . . . , L−2 and (S(fifo_t(fifo_next)+w))−S(fifo_t(L−1))*fifo_x(L−1) where fifo_t(j) is the timestamp stored at location j in the data structure, fifo_next is an index value, and fifo_x(j) is the datum stored at location j in the data structure, and S is the spline function determined from the plurality of knots and the plurality of spline coefficients.

5. The FIRTS of claim 3, wherein the plurality of knots is a superset of all the local maxima and minima of the integral I(k), for −w<=k<=w.

6. The FIRTS of claim 5, wherein the integral I(k) further comprises: a plurality of additional knots added to the superset in order to achieve a filtering error that is less than errors induced by digitization.

7. A method of Finite Impulse Response ("FIR") filtering for a time-synchronized system ("FIRTS"), the FIRTS method comprising:
  receiving input data collected at non-uniform intervals at a controller;
  accessing a data structure by the controller that contains the input data made up of a plurality of at least a timestamp and datum;
  filtering with a FIR filter that has an impulse response and an integral I(k) of the impulse response in the time domain and implemented by the controller;

approximating with the controller the integral $I(k)$ of the impulse response using the input data that results in filtered data; wherein said FIR filter filtering the input data using the integral $I(k)$ to obtain the filtered data; and outputting filtered data.

8. The FIRTS method of claim 7, wherein the integral $I(k)$ further has a predetermined bandwidth windowed with a windowing function.

9. The FIRTS method of claim 8, further comprising: identifying a plurality of knots k of the integral $I(k)$ with a first knot at $k=-w$ and a last knot at $k=w$; and determining the approximation of the integral $I(k)$ of the impulse response using a spline having a plurality of spline coefficients associated with spline where the spline is determined at time t using the plurality of knots and the plurality of spline coefficients.

10. The FIRTS method of claim 9, further comprising: computing a sum of $S(fifo\_t(2)-S(fifo\_t(fifo\_next)-w))*fifo\_x(1)$ and $(S(fifo\_t(j+1)-S(fifo\_t(j)))*fifo\_x(j)$ for $j=2, 3, \ldots, L-2$ and $(S(fifo\_t(fifo\_next)+w))-S(fifo\_t(L-1))*fifo\_x(L-1)$ to obtain the filtered data, where fifo_t(j) is the timestamp stored at location j in the data structure, fifo_next is an index value, and fifo_x(j) is the datum stored at location j in the data structure, and S is the spline function determined from the plurality of knots and the plurality of spline coefficients.

11. The FIRTS method of claim 9, wherein the plurality of knots is a superset of all the local maxima and minima of the integral $I(k)$, for $-w<=k<=w$.

12. The FIRTS method of claim 11, including: achieving a filtering error that is less than the errors induced by digitization by adding a plurality of additional knots to the superset.

13. A machine-readable medium that contains instructions for implementing a method of Finite Impulse Response ("FIR") filtering for a time-synchronized system ("FIRTS"), the instructions implementing the method comprising:
receiving input data collected at non-uniform intervals at a controller;
accessing a data structure by the controller that contains the input data made up of a plurality of at least a timestamp and datum;
filtering with a FIR filter that has an impulse response and an integral $I(k)$ of the impulse response in the time domain and implemented by the controller;
approximating with the controller the integral $I(k)$ of the impulse response using the input data that results in filtered data; wherein said FIR filter filtering the input data using the integral $I(k)$ to obtain the filtered data; and outputting filtered data.

14. The machine-readable medium that contains instructions for implementing a method of FIR filtering for the FIRTS of claim 13, wherein the integral $I(k)$ further has a predetermined bandwidth windowed with a windowing function.

15. The machine-readable medium that contains instructions for implementing a method of FIR filtering for the FIRTS of claim 13, further including the steps of: identifying a plurality of knots k of the integral $I(k)$ with a first knot at $k=-w$ and a last knot at $k=w$; and determining the approximation of the integral $I(k)$ of the impulse response using a spline having a plurality of spline coefficients associated with spline where the spline is determined at time t using the plurality of knots and the plurality of spline coefficients.

16. The machine-readable medium that contains instructions for implementing a method of FIR filtering for the FIRTS of claim 15, further including the step of summing the plurality of at least a timestamp and datum with the formula $S(fifo\_t(2)-S(fifo\_t(fifo\_next)-w))*fifo\_x(1)$ and $(S(fifo\_t(j+1)-S(fifo\_t(j))) *fifo\_x(j)$ for $j=2, 3, \ldots, L-2$ and $(S(fifo\_t(fifo\_next)+w)-S(fifo\_t(L-1))*fifo\_x(L-1)$, to obtain the filtered data, where fifo_t(j) is the timestamp stored at location j in the data structure, fifo_next is an index value, and fifo_x(j) is the datum stored at location j in the data structure, and S is the spline function determined from the plurality of knots and the plurality of spline coefficients.

17. The machine-readable medium that contains instructions for implementing a method of FIR filtering for the FIRTS of claim 15, where the plurality of knots is a superset of all the local maxima and minima of the integral $I(k)$, for $-w<=k<=w$.

\* \* \* \* \*